US007994832B2

(12) United States Patent
Ali et al.

(10) Patent No.: US 7,994,832 B2
(45) Date of Patent: Aug. 9, 2011

(54) APERTURE GENERATING CIRCUIT FOR A MULTIPLYING DELAY-LOCKED LOOP

(75) Inventors: Tamer M. Ali, Los Angeles, CA (US);
Robert J. Drost, Los Altos, CA (US);
Chih-Kong Ken Yang, Palisades, CA (US)

(73) Assignee: Oracle America, Inc., Redwood Shores, CA (US)

( * ) Notice: Subject to any disclaimer, the term of this patent is extended or adjusted under 35 U.S.C. 154(b) by 84 days.

(21) Appl. No.: 12/613,936

(22) Filed: Nov. 6, 2009

(65) Prior Publication Data

US 2011/0109356 A1     May 12, 2011

(51) Int. Cl.
*H03L 7/00* (2006.01)
(52) U.S. Cl. ......... 327/158; 327/149; 327/153; 327/161
(58) Field of Classification Search .................. 327/149, 327/153, 158, 161
See application file for complete search history.

(56) References Cited

U.S. PATENT DOCUMENTS

| | | | | |
|---|---|---|---|---|
| 6,617,936 B2* | 9/2003 | Dally et al. | ............. | 331/57 |
| 6,952,431 B1* | 10/2005 | Dally et al. | ............. | 370/516 |
| 6,982,579 B2* | 1/2006 | Lee | ............. | 327/158 |
| 7,728,754 B2* | 6/2010 | Gerfers et al. | ............. | 341/166 |
| 2010/0327925 A1* | 12/2010 | Kapusta et al. | ............. | 327/158 |

* cited by examiner

*Primary Examiner* — Lincoln Donovan
*Assistant Examiner* — Patrick O'Neill
(74) *Attorney, Agent, or Firm* — Park, Vaughan, Fleming & Dowler LLP; Steven E. Stupp

(57) ABSTRACT

A multiplying delay-locked loop (MDLL) is described. In the MDLL, a phase interpolator (PI) provides a correction signal to selection control logic by phase mixing two internal signals (which have different phases) from a sequence of delay elements in the MDLL. This correction signal compensates for a delay associated with the selection control logic, thereby ensuring that a selection pulse or signal output by the selection control logic to a selection circuit (such as a multiplexer) is appropriately timed so that the selection circuit can selectively injection lock the sequence of delay elements using edges in a reference signal.

20 Claims, 7 Drawing Sheets

APERTURE GENERATING CIRCUIT FOR A MULTIPLYING DELAY-LOCKED LOOP

BACKGROUND

1. Field

The present disclosure generally relates to a multiplying delay-locked-loop (MDLL) circuit. More specifically, the present disclosure relates to an MDLL that includes a phase interpolator which adjusts aperture timing for the MDLL.

2. Related Art

Timing circuits are widely used in electronic devices and systems to generate signals and to synchronize the operation of components. One type of existing timing circuit is a multiplying delay-locked loop (MDLL), such as MDLL 100 shown in FIG. 1. In this MDLL, each rising edge of the input reference clock signal (rclk) enters an inverting delay line via a multiplexer. After each edge passes, the multiplexer switches to select the output of the delay element, thereby connecting the circuit into a ring oscillator. Furthermore, after passing M−1 rising edges (and the preceding falling edges) in this configuration, selection control logic produces a selection pulse (sel) that switches the multiplexer back to route the next rising edge on rclk into the delay element. When this next edge arrives, it is compared against the rising edge on output clock signal (bclk) using a phase detector (which is shown as a D-flip flop in FIG. 1), and the delay-element control voltage (vctrl) is adjusted to align the two edges. Note that once the loop is locked M pulses are generated on bclk for each input pulse on rclk, and the rising edge of each $M^{th}$ output pulse is aligned with the rising edge of each input pulse.

This MDLL design offers several advantages. Notably, each rising edge of rclk zeros the phase error of the output bclk. Thus, MDLL 100 can avoid the phase-error accumulation that inherently occurs in a phase-locked loop (PLL). Furthermore, because a single delay element is used to generate the edges of bclk, there is no fixed pattern jitter due to device mismatch. In addition, the multiplication rate can be programmed by changing the number of cycles of bclk that are recirculated before the selection control logic switches the multiplexer.

However, several issues associated with the design of MDLL 100 typically require careful attention. In particular, the input rclk typically must be kept very clean, because any jitter on this signal will be passed directly to the output and will appear during a single cycle. (This is usually not a serious issue because inexpensive crystal oscillators have sufficiently low jitter for this application.) In addition, any mismatch in the phase of bclk and rclk will result in fixed-pattern jitter that occurs on every Mth bclk edge (where M is the multiplication ratio). Reducing this fixed pattern jitter to acceptable levels often requires a novel phase comparator design and careful attention to the design of the selection and multiplexing circuits.

A variety of techniques have been proposed to reduce the fixed pattern jitter. For example, in one proposed MDLL cycle-to-cycle jitter is filtered by applying the output signal from the MDLL to a replica slave oscillator, which is connected to the same control voltage. However, this technique often has the usual drawback of injection locking, i.e., the mismatch between the master and the slave oscillators requires the injection strength to be strong enough to guarantee locking, which usually limits the filtering quality.

In another proposed MDLL, an auxiliary loop is used to sense the pattern error, and a resulting error signal is added to the control voltage to correct for the pattern error. For example, in an analog implementation of the auxiliary loop, the error signal may be introduced as an offset to a charge pump to correct for the pattern error. Alternatively, in a digital auxiliary loop a gated ring oscillator may be used to measure the pattern error, and the control voltage may be adjusted based on this error.

In addition, in existing MDLLs it is assumed that the selection control logic can provide the sel pulse quickly enough to select the next reference edge. Moreover, the impact of the position or phase of the sel pulse with respect to the edge in rclk on the pattern jitter is typically not considered. However, there are gate delays associated with the selection control logic, which are a function of process, voltage and temperature variations. These gate delays can make it difficult to use MDLLs in high-frequency applications, and in particular in applications operating at more than 2 GHz.

Hence, what is needed is an MDLL without the above-described problems.

SUMMARY

One embodiment of the present disclosure provides a multiplying delay-locked loop (MDLL) that includes an input node that receives a reference signal, and a sequence of delay elements, which receive an input and produce a first internal signal, a second internal signal and an output signal. Note that the first internal signal has a different phase than the second internal signal. Moreover, a phase interpolator (PI) in the MDLL, which is coupled to the sequence of delay elements, receives the first internal signal and the second internal signal, and provides a correction signal by phase mixing the first internal signal and the second internal signal. Furthermore, control logic in the MDLL, which is coupled to the PI, provides a selection signal based on the correction signal. Additionally, a selection circuit in the MDLL, which is coupled to the input node, the control logic and the sequence of delay elements, selectively couples the reference signal or the output signal to the input of the sequence of delay elements based on the selection signal.

Note that the correction signal, at least in part, corrects for a delay associated with the control logic, thereby ensuring synchronized injection of edges in the reference signal into the output signal. In particular, by correcting for the delay, the selective coupling by the selection circuit may synchronously inject edges in the reference signal into the output signal.

In some embodiments, the output signal has a larger fundamental frequency than the reference signal.

Furthermore, the first internal signal may be associated with a first internal node between a first pair of delay elements in the sequence of delay elements, and the second internal signal may be associated with a second internal node between a second pair of delay elements in the sequence of delay elements. Note that a phase difference between the first internal signal and the second internal signal may be substantially 90°.

In some embodiments, the PI operates over a 360° range of phases. Moreover, the PI may reduce cycle-to-cycle jitter in the output signal by at least an order of magnitude relative to an MDLL without the PI.

In some embodiments, the PI has a set point that determines relative contributions of a phase of the first internal signal and a phase of the second internal signal to the correction signal. The control logic and/or additional control logic may adjust the set point so that edges in the reference signal are synchronously injected into the output signal.

In some embodiments, a timing recovery circuit in the MDLL, which is coupled to the input node, the selection circuit and the sequence of delay elements, provides a timing signal to the selection circuit and the delay elements based on the reference signal and the output signal. For example, the timing recovery circuit may include: a phase-frequency detector coupled to the input node and an output of the sequence of delay elements; and a filter, coupled to the phase-frequency detector, which provides the timing signal to the selection circuit and the delay elements.

Additionally, the control logic may provide the selection signal based on the correction signal and a signal corresponding to the correction signal. This signal may be provided by a divide-by-M circuit in the MDLL, which is coupled to the PI.

Another embodiment provides a circuit that includes the MDLL.

Another embodiment provides an electronic device that includes the circuit and/or the MDLL.

Another embodiment provides a method for providing the output signal using the MDLL. During the method, the reference signal is received at the input node of the MDLL, and a signal is received at the input to the sequence of delay elements in the MDLL. Then, using the sequence of delay elements in the MDLL, a first internal signal, a second internal signal and the output signal are provided, where the first internal signal has a different phase than the second internal signal. Moreover, using the PI in the MDLL, the correction signal is provided by phase mixing the first internal signal and the second internal signal. Furthermore, using the control logic in the MDLL, the selection signal is provided based on the correction signal. Next, using the selection circuit in the MDLL, the reference signal or the output signal is selectively provided based on the selection signal to produce the signal at the input of the sequence of delay elements.

BRIEF DESCRIPTION OF THE FIGURES

Note that like reference numerals refer to corresponding parts throughout the drawings. Moreover, multiple instances of the same part are designated by a common prefix separated from an instance number by a dash.

DETAILED DESCRIPTION

The following description is presented to enable any person skilled in the art to make and use the disclosure, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present disclosure is not intended to be limited to the embodiments shown, but is to be accorded the widest scope consistent with the principles and features disclosed herein.

Embodiments of a multiplying delay-locked loop (MDLL), an integrated circuit that includes the MDLL, an electronic device that includes the integrated circuit, and a method for providing an output signal using the MDLL are described. In the MDLL, a phase interpolator (PI) provides a correction signal to selection control logic by phase mixing two internal signals (which have different phases) from a sequence of delay elements in the MDLL. This correction signal compensates for a delay associated with the selection control logic, thereby ensuring that a selection pulse or signal output by the selection control logic to a selection circuit (such as a multiplexer) is appropriately timed so that the selection circuit can selectively injection lock the sequence of delay elements using edges in a reference signal.

By correcting for the delay of the selection control logic, this MDLL may be used in high-frequency applications, such as those where the timing relationship between the selection signal and the reference signal, and the timing relationship between the selection signal and the output signal from the MDLL are not precisely defined. In particular, in contrast with existing MDLLs, the selection signal is not tied to a specific buffer delay (such as that associated with the latency between the output signal from the MDLL and the selection control logic), which usually limits the maximum frequency of operation if the selection signal cannot be generated in less than a clock cycle. Furthermore, the correction signal allows the selection signal to be smoothly moved through a range of possible time delays. In addition, a control loop in the MDLL can optimize the timing of the selection signal relative to the reference signal, which reduces or eliminates the cycle-to-cycle jitter of the MDLL (which is associated with the dependence of the injected reference-signal edges on the selection signal) and, thus, the phase spur of the MDLL in the frequency domain. Consequently, the noise rejection of the MDLL may be significantly improved. For example, the phase spur of the MDLL may be 100 fs, as opposed to the 2-5 ps in existing MDLLs.

Figure 1:
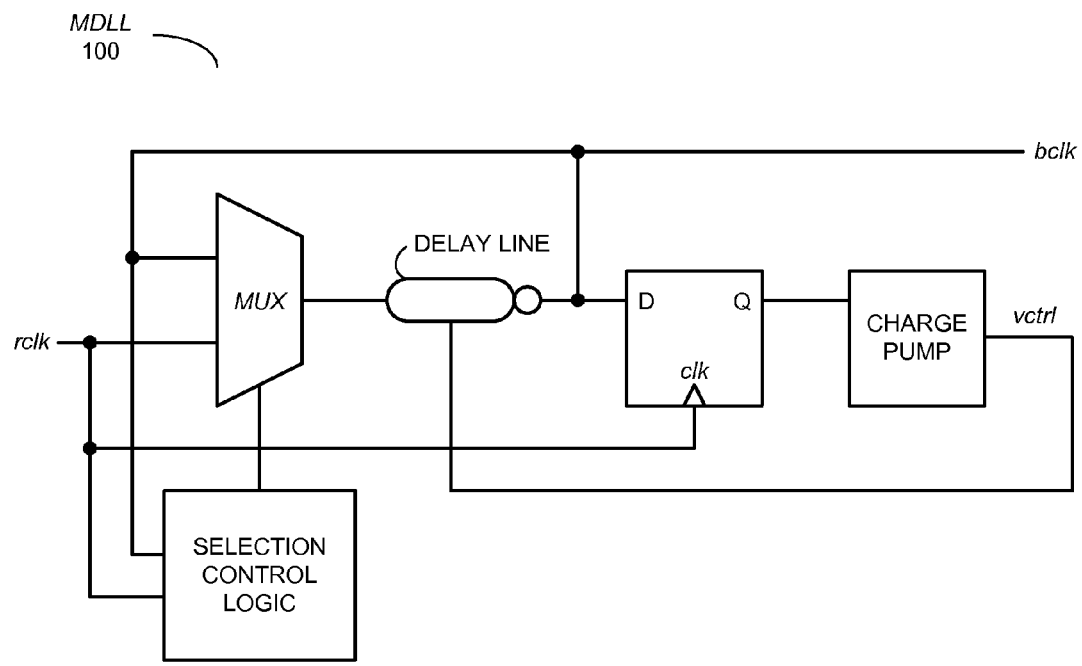
FIG. 1 is a block diagram illustrating an existing multiplying delay-locked loop (MDLL).
Figure 2:
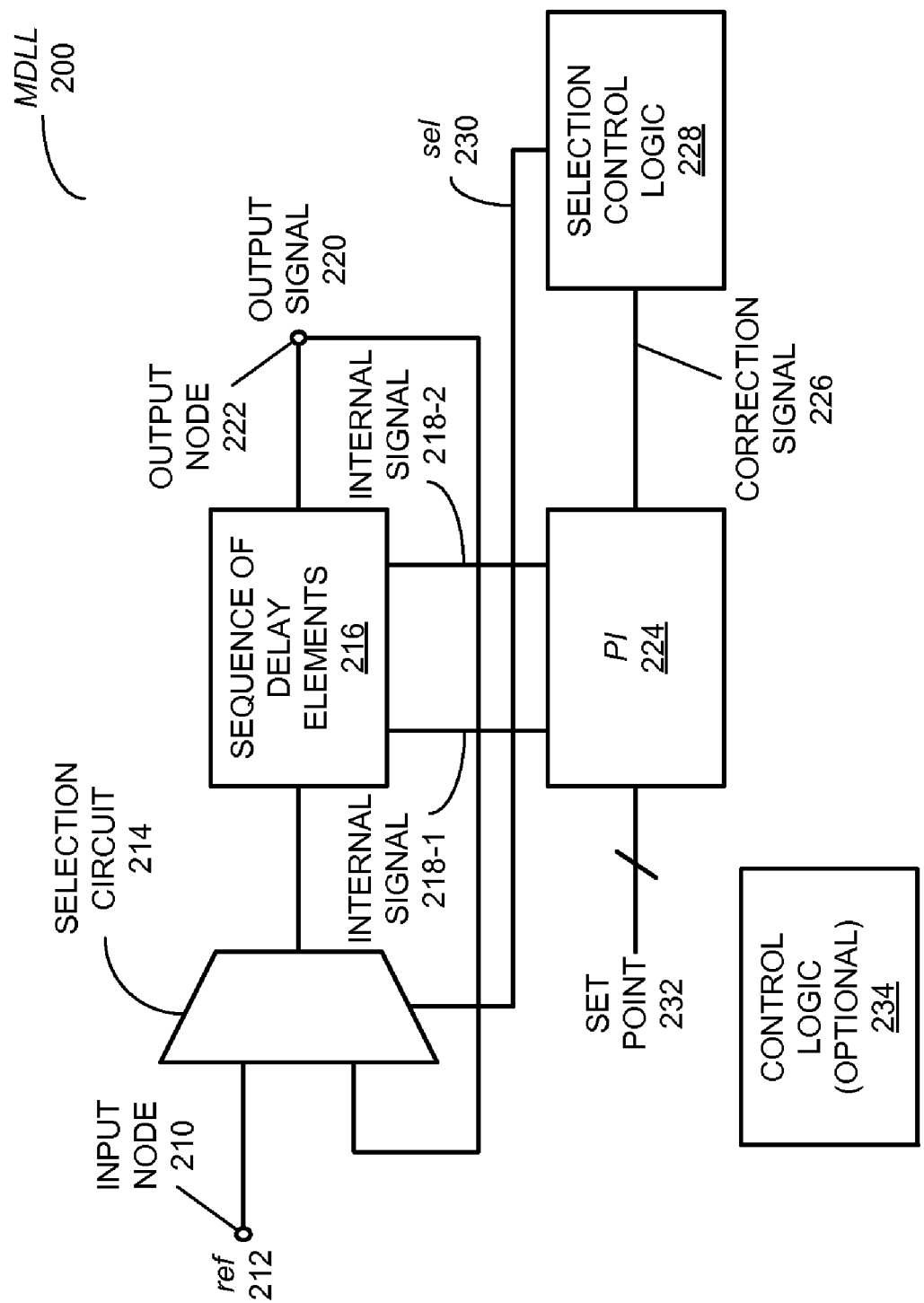
FIG. 2 is a block diagram illustrating an MDLL in accordance with an embodiment of the present disclosure.

We now describe embodiments of the MDLL. FIG. 2 presents a block diagram illustrating an MDLL 200. This MDLL includes an input node 210 that receives a reference signal (ref) 212 (such as a reference clock signal), and a sequence of delay elements 216 (such as a delay line or a voltage-controlled oscillator), which receive an input from selection circuit 214 (such as a multiplexer) and produce a first internal signal 218-1, a second internal signal 218-2 and/or an output signal 220 (such as an output clock signal) at output node 222. Note that first internal signal 218-1 has a different phase than the second internal signal 218-2. For example, first internal signal 218-1 may be associated with an internal node 308 (FIG. 3) between a first pair of delay elements in sequence of delay elements 216, and second internal signal 218-2 may be associated with output node 222 between a second pair of delay elements in sequence of delay elements 216. In some embodiments, a phase difference between first internal signal 218-1 and second internal signal 218-2 may be substantially 90°, i.e., internal signals 218 may be quadrature signals. In addition, output signal 220 may have a larger fundamental frequency than reference signal 212.

Moreover, a phase interpolator (PI) 224 (which is sometimes referred to as a 'phase rotator'), which is coupled to sequence of delay elements 216, receives first internal signal 218-1 and second internal signal 218-2, and provides a correction signal 226 by phase mixing first internal signal 218-1 and second internal signal 218-2. For example, PI 224 may operate over a 360° range of phases (i.e., one complete clock cycle).

Furthermore, selection control logic 228, which is coupled to PI 224, provides a selection pulse or signal (sel) 230 based on correction signal 226. In particular, selection control logic 228 may count edges in correction signal 226 and may generate the selection signal 230 every M clock edges. Note that the combination of PI 224 and selection control logic 228 may constitute an aperture generating circuit that (as discussed below) controls the timing of an aperture provided by selection circuit 214. In this way, MDLL 200 may have improved noise rejection (and reduced jitter) by injecting an edge from reference signal 212 every M clock cycles.

Additionally, selection circuit 214, which is coupled to input node 210, selection control logic 228 and sequence of delay elements 216, selectively couples reference signal 212 or output signal 220 to the input of sequence of delay elements 216 based on selection signal 230, i.e., selection circuit 214 may open an aperture for edge injection from reference signal 212.

Note that by inserting PI 224 as shown in FIG. 2, the timing of selection signal 230 is decoupled from reference signal 212 and output signal 220. This means that a phase of selection signal 230 can be arbitrarily adjusted with respect to the edges in reference signal 212 during a clock cycle, regardless of the latency of selection control logic 228 with respect to the voltage-controlled-oscillator output signals (i.e., internal signals 218 and/or output signal 220). Consequently, PI 224 can, at least in part, compensate or correct for an arbitrary latency or delay of selection control logic 228, thereby ensuring synchronized injection of edges in reference signal 212 into output signal 220 by selection circuit 214. As described further below, the ability to adjust the phase of selection signal 230 also facilitates a reduced or minimum dependence of the cycle-to-cycle jitter on the phase of selection signal 230, which is often useful in high-speed applications.

In some embodiments, PI 224 has a set point 232 that determines relative contributions of a phase of first internal signal 218-1 and a phase of second internal signal 218-2 to correction signal 226 (i.e., sets the output phase from PI 224). A control loop that includes selection control logic 228 and/or optional control logic 234 may adjust set point 232 so that edges in reference signal 212 are synchronously injected into output signal 220, and so that cycle-to-cycle jitter is reduced or minimized. For example, set point 232 may be determined during a calibration mode and/or during normal operation of MDLL 200. Because the latency of selection control logic 228 and the pattern jitter are static characteristics of MDLL 200, calibration of set point 232 may be determined once for every frequency setting of MDLL 200, at start up of MDLL 200, or as needed.

Figure 3:
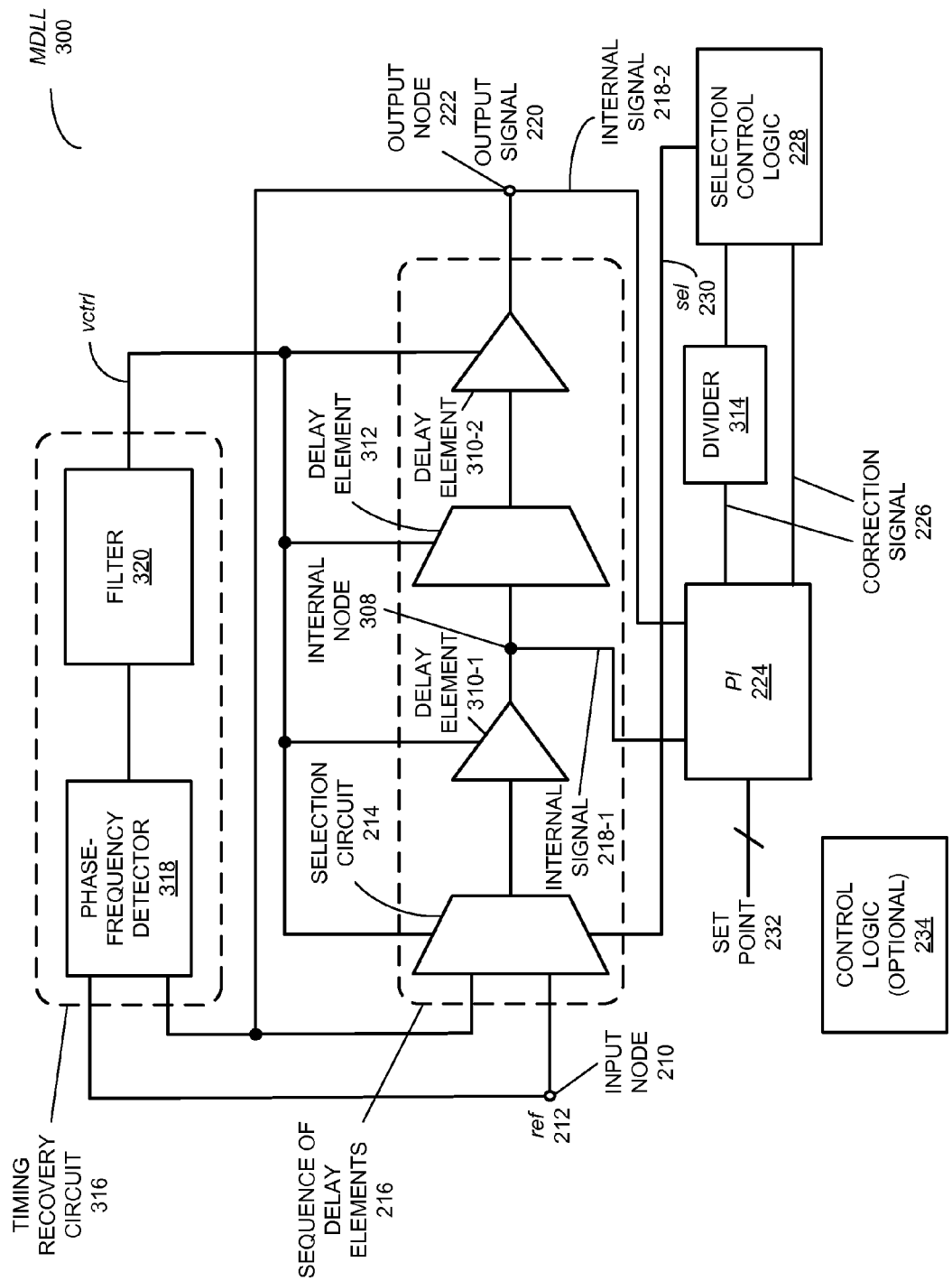
FIG. 3 is a block diagram illustrating an MDLL in accordance with an embodiment of the present disclosure.

Another embodiment of the MDLL is shown in FIG. 3, which presents a block diagram illustrating an MDLL 300. In this MDLL, sequence of delay elements 216 includes four delay elements, one of which is selection circuit 214. Delay elements 310 are typical delay cells, while the first delay element (selection circuit 214) is an edge-insertion multiplexer and delay element 312 is a replica multiplexer configured as a delay cell (in particular, its selection-signal terminal is coupled to a fixed setting and its other input is coupled to ground). This configuration ensures symmetry between the two halves of the resulting delay line. Consequently, internal signals 218, which are associated with internal node 308 and output node 222, may be quadrature signals. In general, the phase difference between internal signals 218 does not need to be exactly 90°. However, the accuracy of quadrature generation can affect the ability of PI 224 to generate equal phase steps when transitioning from one internal signal to the other.

Furthermore, correction signal 226 from PI 224 may be coupled to divider 314 (which performs a divide-by-M operation), and then to selection control logic 228, which provides selection signal 230 based on correction signal 226 and a signal corresponding to correction signal 226 that is output by divider 314.

Additionally, MDLL 300 may include a timing recovery circuit 316, which is coupled to input node 210 and sequence of delay elements 216, and which provides a timing signal (vctrl) to selection circuit 214 and the delay elements based on reference signal 212 and output signal 220. For example, timing recovery circuit 316 may include: a phase-frequency detector 318 coupled to input node 210 and output node 222; and a filter 320, coupled to phase-frequency detector 318, which provides the timing signal to the selection circuit 214 and the delay elements.

Figure 4:
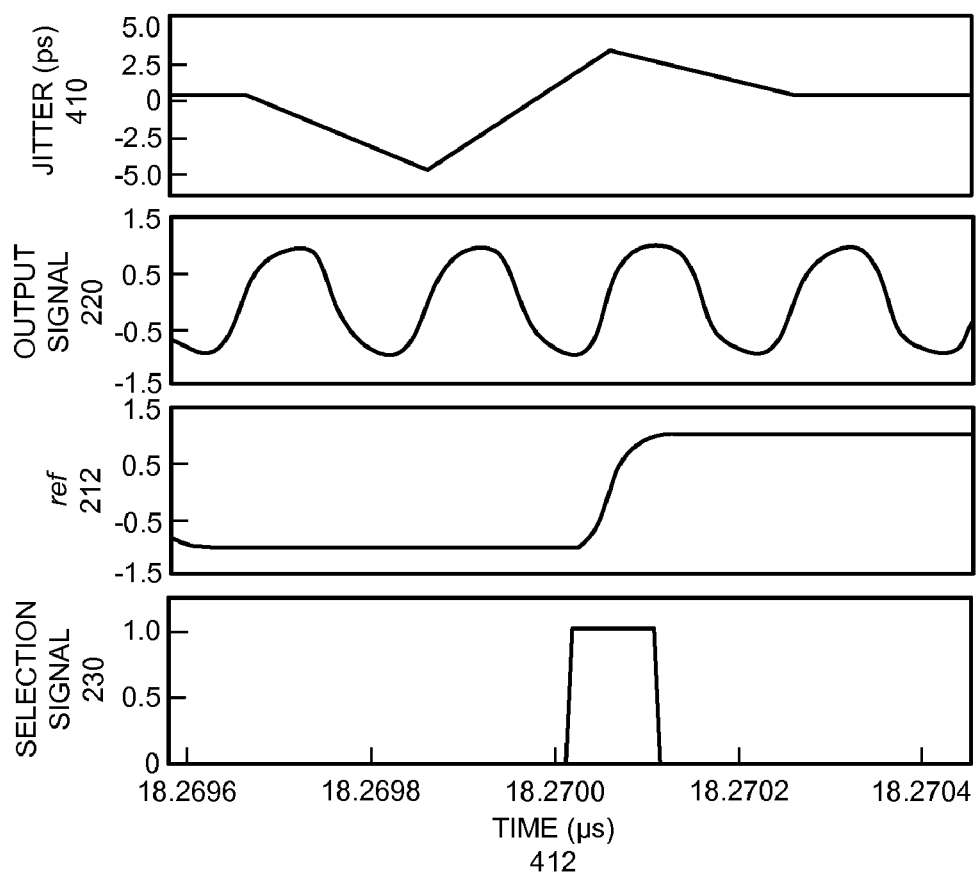
FIG. 4 is a sequence of graphs illustrating signals in an MDLL in accordance with an embodiment of the present disclosure.

We now present simulation results. FIG. 4 presents graphs 400 illustrating signals in an MDLL, such as MDLL 200 (FIG. 2) or 300 (FIG. 3). In particular, the top graph shows the cycle-to-cycle jitter 410 as a function of time 412; the second graph shows output signal 220 as a function of time 412; the third graph shows reference signal 212 as a function of time 412; and the bottom graph shows selection signal 230 (crudely centered on edges in reference signal 212) as a function of time 412. Note that, even though selection signal 230 is approximately centered on edges in reference signal 212, there is still some 4 ps of cycle-to-cycle jitter in the top graph. This is because at high frequency, when the bit time in reference signal 212 is comparable to the rise and fall times, the optimal placement of selection signal 230 may need to be slightly shifted from the center position to accommodate the large rise time of the edges in reference signal 212. As noted previously, PI 224 (FIGS. 2 and 3) can be used to shift selection signal 230 slightly earlier or later to reduce or minimize the cycle-to-cycle jitter.

Figure 5:
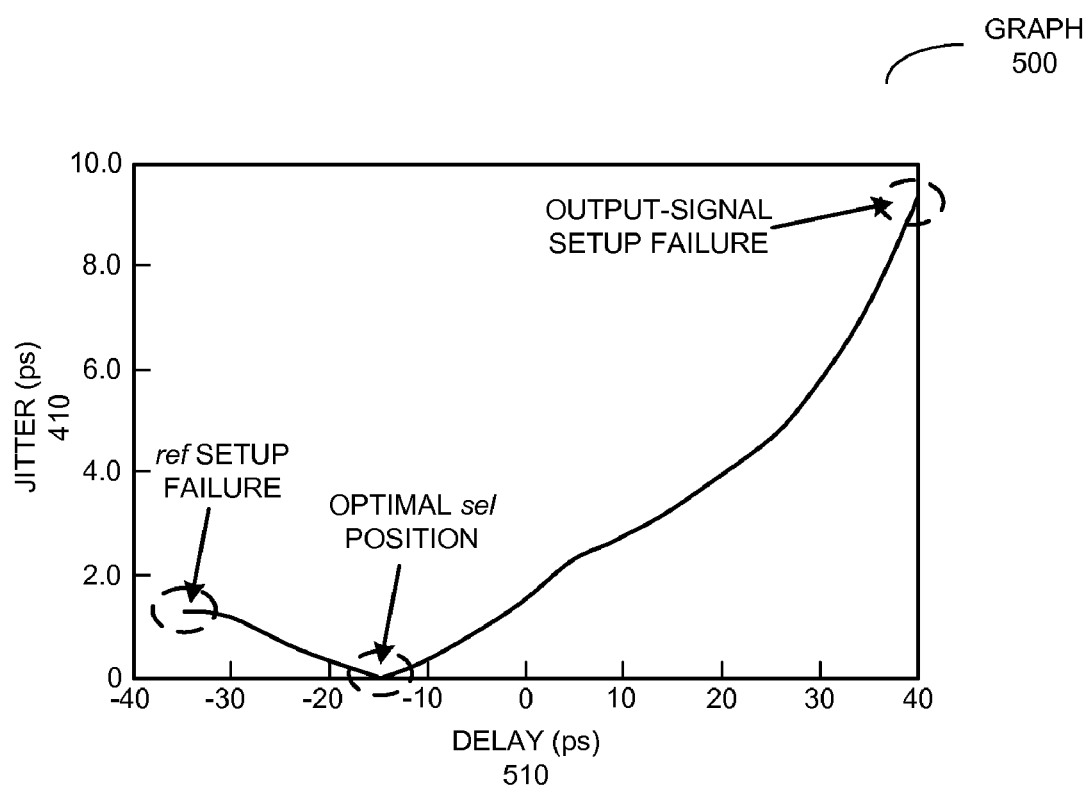
FIG. 5 is a graph illustrating cycle-to-cycle jitter as a function of a delay of a selection signal in an MDLL in accordance with an embodiment of the present disclosure.

This is shown in FIG. 5, which presents a graph 500 illustrating cycle-to-cycle jitter 410 as a function of a delay 510 of selection signal 230 (FIGS. 2 and 3) in an MDLL, such as MDLL 200 (FIG. 2) or 300 (FIG. 3). At the left-hand side of graph 500, operation of the MDLL fails because of a setup-time violation of insertion of the edges in reference signal 212 (FIGS. 2 and 3). On the right-hand side of graph 500, operation of the MDLL fails because of an output-signal setup violation. In graph 500, note that cycle-to-cycle jitter 410 goes to zero at a particular set point 232 of PI 224 (FIGS. 2 and 3).

In an exemplary embodiment, reference signal 212 (FIGS. 2 and 3) is a 500 MHz clock signal, and output signal 220 (FIGS. 2 and 3) is a 5 GHz clock signal. Furthermore, PI 224 (FIGS. 2 and 3) may have 5-7 bit resolution or 16 phase steps or levels.

In some embodiments, PI 224 (FIGS. 2 and 3) is implemented using a weighting circuit that mixes phases of internal signals 218 (FIGS. 2 and 3) based on impedance values in two arms of a voltage divider. For example, the impedances may be capacitors, the impedance values may be associated capacitances, and the phases may be summed at a central node between the two arms according to the weighted sum of the capacitances. Furthermore, a biasing circuit, which is coupled to the central node, may amplify the interpolated signal to the desired swing on an output node of PI 224 (FIGS. 2 and 3), and may set the DC common mode for the central node (i.e., it may provide DC bias). Note that the capacitors may be passive, linear components. In addition, the capacitance values may be selectable, for example, using a switched capacitance network with pass gates coupled to capacitors in banks of parallel capacitors (such as metal capacitors that each have a capacitance of a few fempto Farads). At a given time, control signals may select a desired capacitance value by opening and/or closing pass gates so that only one of internal signals 218 (FIGS. 2 and 3) is coupled to a given capacitor.

Figure 6:
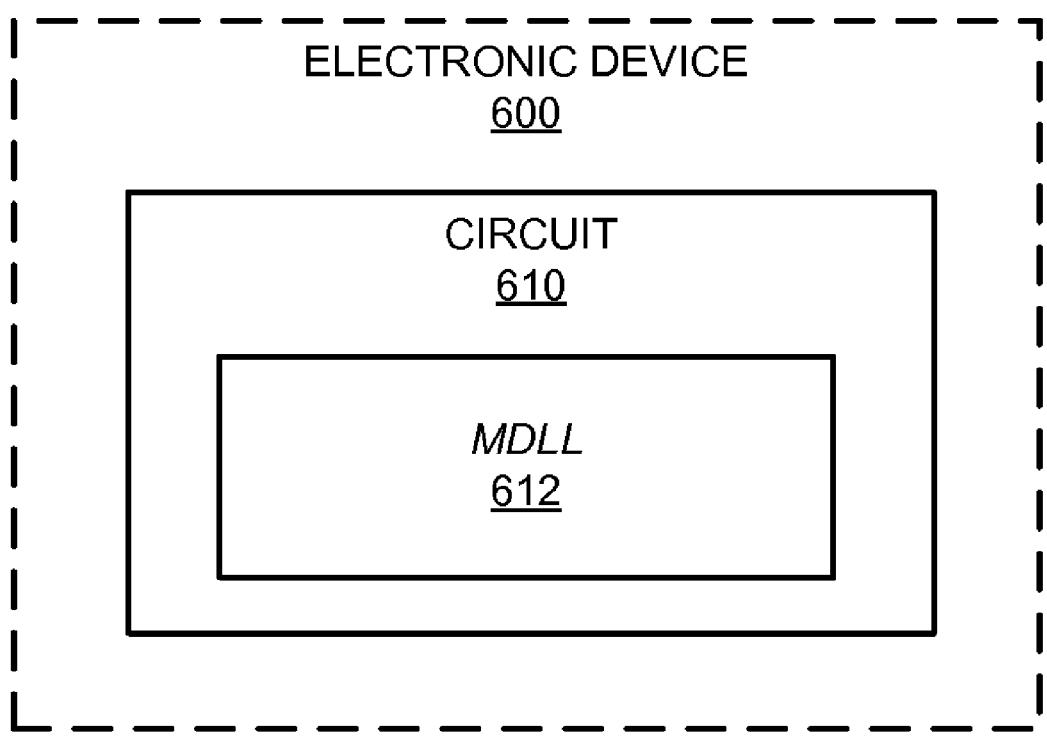
FIG. 6 is a block diagram of an electronic device that includes an MDLL in accordance with an embodiment of the present disclosure.

We now describe embodiments of a circuit and an electronic device that includes one of the preceding embodiments of the MDLL, such as MDLL 200 (FIG. 2) or 300 (FIG. 3). FIG. 6 presents a block diagram of an electronic device 600 that includes an MDLL 612 in circuit 610. For example, circuit 610 may be an integrated circuit.

Note that electronic device 600 may include, but is not limited to: a server, a laptop computer, a communication device or system, a personal computer, a work station, a mainframe computer, a blade, an enterprise computer, a data center, a portable-computing device, a supercomputer, a network-attached-storage (NAS) system, a storage-area-network (SAN) system, and/or another electronic computing device. Moreover, note that a given computer system may be at one location or may be distributed over multiple, geographically dispersed locations.

More generally, embodiments of the MDLL may be used in a variety of applications, including: VLSI circuits, communication systems, storage area networks, data centers, networks (such as local area networks), and/or computer systems (such as multiple-core processor computer systems). For example, embodiments of the MDLL may be used in a high-speed serial link in a processor, a memory controller (including buffer-onboard application-specific integrated circuits), and/or a switch chip at speeds up to 16 Gb per second per channel. By reducing the phase spur and increasing the maximum frequency of operation, embodiments of the MDLL may be used in these applications instead of other components, such as multiplying PLLs.

MDLL 200 (FIG. 2), MDLL 300 (FIG. 3) and/or electronic device 600 may include fewer components or additional components. Although MDLL 200 (FIG. 2), MDLL 300 (FIG. 3) and/or electronic device 600 are illustrated as having a number of discrete items, these circuits and devices are intended to be functional descriptions of the various features that may be present rather than structural schematics of the embodiments described herein. Consequently, in these embodiments two or more components may be combined into a single component, and/or a position of one or more components may be changed. Furthermore, note that circuits in these embodiments may be implemented using PMOS and/or NMOS, and signals may include digital signals that have approximately discrete values and/or analog signals that have continuous values.

Figure 7:
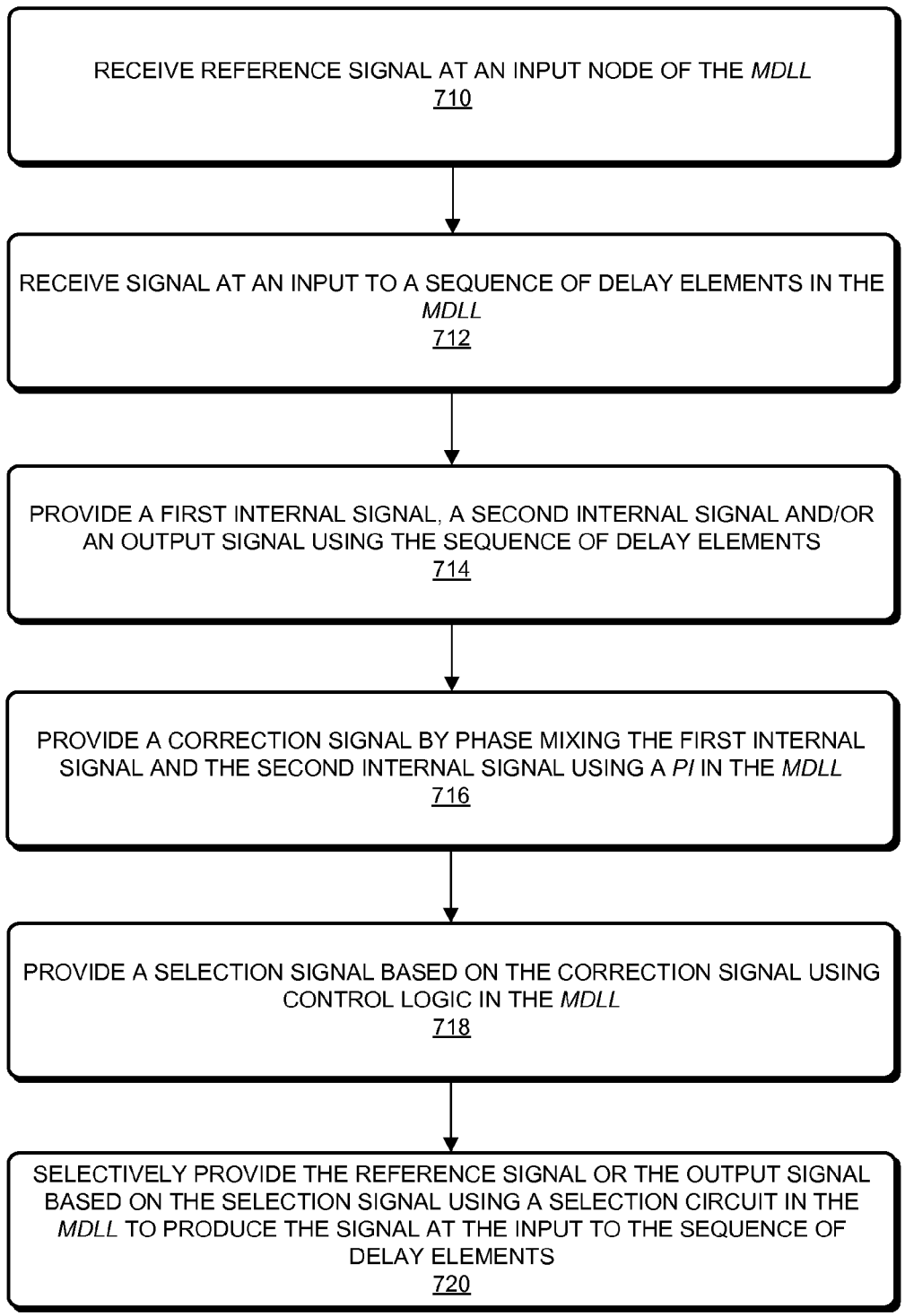
FIG. 7 is a flow chart illustrating a process for providing an output signal using an MDLL in accordance with an embodiment of the present disclosure.

We now describe embodiments of a process. FIG. 7 presents a flow chart illustrating a process 700 for providing an output signal using an MDLL, such as MDLL 200 (FIG. 2) or 300 (FIG. 3). During this method, a reference signal is received at the input node of the MDLL (operation 710), and a signal is received at the input to the sequence of delay elements in the MDLL (operation 712). Then, using the sequence of delay elements in the MDLL, a first internal signal, a second internal signal and/or the output signal are provided (operation 714), where the first internal signal has a different phase than the second internal signal. Moreover, using the PI in the MDLL, a correction signal is provided by phase mixing the first internal signal and the second internal signal (operation 716). Furthermore, using the control logic in the MDLL, a selection signal is provided based on the correction signal (operation 718). Next, using the selection circuit in the MDLL, the reference signal or the output signal is selectively provided based on the selection signal to produce the signal at the input of the sequence of delay elements (operation 720).

In some embodiments of process 700, there are additional or fewer operations. Moreover, the order of the operations may be changed, and/or two or more operations may be combined into a single operation.

The foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art. Additionally, the above disclosure is not intended to limit the present disclosure. The scope of the present disclosure is defined by the appended claims.

What is claimed is:

1. A multiplying delay-locked loop (MDLL), comprising:
   an input node configured to receive a reference signal;
   a sequence of delay elements, which receives an input and is configured to produce a first internal signal, a second internal signal and an output signal, wherein the first internal signal has a different phase than the second internal signal;
   a phase interpolator (PI), coupled to the sequence of delay elements, configured to receive the first internal signal and the second internal signal, and to provide a correction signal by phase mixing the first internal signal and the second internal signal;
   control logic, coupled to the PI, configured to provide a selection signal based on the correction signal; and
   a selection circuit, coupled to the input node, the control logic and the sequence of delay elements, configured to selectively couple the reference signal or the output signal to the input of the sequence of delay elements based on the selection signal.

2. The MDLL of claim 1, wherein the correction signal, at least in part, corrects for a delay associated with the control logic, thereby ensuring synchronized injection of edges in the reference signal into the output signal.

3. The MDLL of claim 1, wherein the output signal has a larger fundamental frequency than the reference signal.

4. The MDLL of claim 1, wherein the first internal signal is associated with a first internal node between a first pair of delay elements in the sequence of delay elements, and the second internal signal is associated with a second internal node between a second pair of delay elements in the sequence of delay elements.

5. The MDLL of claim 1, wherein the selective coupling by the selection circuit synchronously injecting edges in the reference signal into the output signal.

6. The MDLL of claim 1, wherein the PI operates over a 360° range of phases.

7. The MDLL of claim 1, wherein the PI reduces cycle-to-cycle jitter in the output signal by at least an order of magnitude relative to an MDLL without the PI.

8. The MDLL of claim 1, wherein a phase difference between the first internal signal and the second internal signal is substantially 90°.

9. The MDLL of claim 1, wherein the PI has a set point that determines relative contributions of a phase of the first internal signal and a phase of the second internal signal to the correction signal.

10. The MDLL of claim 9, wherein the control logic is configured to adjust the set point so that edges in the reference signal are synchronously injected into the output signal.

11. The MDLL of claim 1, further comprising a timing recovery circuit, coupled to the input node, the selection circuit and the sequence of delay elements, configured to provide a timing signal to the selection circuit and the delay elements based on the reference signal and the output signal.

12. The MDLL of claim 11, wherein the timing recovery circuit includes:
   a phase-frequency detector coupled to the input node and an output of the sequence of delay elements; and
   a filter, coupled to the phase-frequency detector, configured to provide the timing signal to the selection circuit and the delay elements.

13. The MDLL of claim 1, wherein the control logic is configured to provide the selection signal based on the correction signal and a signal corresponding to the correction signal; and
   wherein the MDLL further includes a divide-by-M circuit, coupled to the PI, configured to provide the signal based on the correction signal.

14. A circuit, comprising an MDLL, wherein the MDLL includes:
   an input node configured to receive a reference signal;
   a sequence of delay elements configured to receive an input and to produce a first internal signal, a second internal signal and an output signal, wherein the first internal signal has a different phase than the second internal signal;
   a PI, coupled to the sequence of delay elements, configured to receive the first internal signal and the second internal signal, and to provide a correction signal by phase mixing the first internal signal and the second internal signal;
   control logic, coupled to the PI, configured to provide a selection signal based on the correction signal; and
   a selection circuit, coupled to the input node, the control logic and the sequence of delay elements, configured to selectively couple the reference signal or the output signal to the input of the sequence of delay elements based on the selection signal.

15. The circuit of claim 14, wherein the correction signal, at least in part, corrects for a delay associated with the control logic, thereby ensuring synchronized injection of edges in the reference signal into the output signal.

16. The circuit of claim 14, wherein the selective coupling by the selection circuit synchronously injecting edges in the reference signal into the output signal.

17. The circuit of claim 14, wherein the PI has a set point that determines relative contributions of a phase of the first internal signal and a phase of the second internal signal to the correction signal.

18. The circuit of claim 17, wherein the control logic is configured to adjust the set point so that edges in the reference signal are synchronously injected into the output signal.

19. The circuit of claim 14, wherein the control logic is configured to provide the selection signal based on the correction signal and a signal corresponding to the correction signal; and
   wherein the MDLL further includes a divide-by-M circuit, coupled to the PI, configured to provide the signal based on the correction signal.

20. A method for providing an output signal using an MDLL, comprising:
   receiving a reference signal at an input node of the MDLL;
   receiving a signal at an input to a sequence of delay elements;
   providing a first internal signal, a second internal signal and the output signal using the sequence of delay elements in the MDLL, wherein the first internal signal has a different phase than the second internal signal;
   providing a correction signal by phase mixing the first internal signal and the second internal signal using a PI in the MDLL;
   providing a selection signal based on the correction signal using control logic in the MDLL; and
   selectively providing the reference signal or the output signal to produce the signal at the input of the sequence of delay elements based on the selection signal using a selection circuit in the MDLL.

* * * * *